(12) United States Patent
Brombach

(10) Patent No.: US 12,066,474 B2
(45) Date of Patent: Aug. 20, 2024

(54) WIND TURBINE AND METHOD FOR DETECTING LOW-FREQUENCY OSCILLATIONS IN AN ELECTRICAL SUPPLY GRID

(71) Applicant: Wobben Properties GmbH, Aurich (DE)

(72) Inventor: Johannes Brombach, Berlin (DE)

(73) Assignee: Wobben Properties GmbH, Aurich (DE)

( * ) Notice: Subject to any disclaimer, the term of this patent is extended or adjusted under 35 U.S.C. 154(b) by 582 days.

(21) Appl. No.: 17/270,818

(22) PCT Filed: Jul. 31, 2019

(86) PCT No.: PCT/EP2019/070611
§ 371 (c)(1),
(2) Date: Feb. 23, 2021

(87) PCT Pub. No.: WO2020/038692
PCT Pub. Date: Feb. 27, 2020

(65) Prior Publication Data
US 2021/0208186 A1 Jul. 8, 2021

(30) Foreign Application Priority Data
Aug. 24, 2018 (DE) .................... 10 2018 120 751.4

(51) Int. Cl.
*G01R 23/177* (2006.01)
*G01R 19/25* (2006.01)
(Continued)

(52) U.S. Cl.
CPC ....... *G01R 23/177* (2013.01); *G01R 19/2509* (2013.01); *G01R 19/2513* (2013.01);
(Continued)

(58) Field of Classification Search
CPC .............................. G01R 23/177; H02J 3/241
(Continued)

(56) References Cited

U.S. PATENT DOCUMENTS 9,568,513 B2 * 2/2017 Venkatasubramanian ...................
G01R 19/2513
2009/0099798 A1 4/2009 Gong et al.
(Continued)

FOREIGN PATENT DOCUMENTS

CN 101408577 A 4/2009
WO 2012/000514 A2 1/2012

*Primary Examiner* — Ricky Go
(74) *Attorney, Agent, or Firm* — Seed IP Law Group LLP

(57) ABSTRACT

A method for detecting low-frequency oscillations, in particular subsynchronous resonances, in an electrical supply grid is provided. The grid has a line voltage with a rated line frequency. The method comprises recording first and second series of measurements each for performing a frequency analysis (FFT). The method includes performing a lower frequency analysis for the first series for a lower frequency range and forming a lower amplitude spectrum. The method includes performing an upper frequency analysis for the second series for an upper frequency range and forming an upper amplitude spectrum. The method includes testing whether a low-frequency oscillation component can be identified in the lower amplitude spectrum, and testing whether a low-frequency oscillation component can be identified in the upper amplitude spectrum, where the presence of a low-frequency oscillation is assumed when a low-frequency oscillation component is identified in at least one of the lower and upper amplitude spectra.

18 Claims, 6 Drawing Sheets

(51) Int. Cl.
*H02J 3/24* (2006.01)
*H02J 3/38* (2006.01)

(52) U.S. Cl.
CPC ............. *H02J 3/241* (2020.01); *H02J 3/381* (2013.01); *H02J 2300/28* (2020.01)

(58) Field of Classification Search
USPC .......................................................... 702/65
See application file for complete search history.

(56) References Cited

U.S. PATENT DOCUMENTS

| | | | |
|---|---|---|---|
| 2009/0222144 A1 | 9/2009 | Venkatasubramanian et al. | |
| 2012/0004781 A1* | 1/2012 | Santos | H02J 3/241 700/287 |
| 2016/0003879 A1* | 1/2016 | Wilson | H02J 3/241 324/76.12 |
| 2016/0033321 A1* | 2/2016 | Picand | G01H 1/10 73/660 |
| 2016/0336888 A1* | 11/2016 | Busker | F03D 9/257 |
| 2017/0276539 A1 | 9/2017 | Bengtsson et al. | |
| 2018/0138709 A1 | 5/2018 | Hamann | |

* cited by examiner

WIND TURBINE AND METHOD FOR DETECTING LOW-FREQUENCY OSCILLATIONS IN AN ELECTRICAL SUPPLY GRID

BACKGROUND

Technical Field

The present invention relates to a method for detecting low-frequency oscillations, in particular subsynchronous resonances, in an electrical supply grid. The present invention also relates to a wind power system, namely a wind turbine or a wind farm, for detecting low-frequency oscillations, in particular subsynchronous resonances, in an electrical supply grid.

Description of the Related Art

Many electrical supply grids increasingly have regenerative power generating units, in particular wind turbines or wind farms. The increasing proportion of these in the electrical supply grid means that it is also becoming increasingly more important to use wind turbines and wind farms for supporting the electrical supply grid, or at least to consider them in addition.

One problem which may occur in the electrical supply grid, which can also simply be referred to as grid, are oscillations, namely oscillations of the power system, which can also be referred to as "power system oscillations" (PSO). There may be a great variety of causes for such power system oscillations, and a clear and simple example is that two directly coupled synchronous generators of conventional power stations which inject, for example, at a distance from one another of over 100 kilometers, oscillate in opposition to one another. However, it is also possible that even a single synchronous generator which is coupled directly to the electrical supply grid is caused to oscillate at its natural frequency owing to local excitation, such as a sudden change in the power consumption of the connected consumers. Conventional electrical supply grids counteract such problems generally as a result of correspondingly stable regulation of the synchronous generators injecting directly into the electrical supply grid. A high degree of inertia of these synchronous generators together with a damping behavior which is physically dependent and/or dependent on the structural design of the respective generator generally prevents the excessive occurrence of such oscillations in conventional grids.

Regenerative generating units, in particular wind turbines or wind farms, however, do not have such properties per se. In particular, they have virtually no physically dependent properties which can counteract such low-frequency oscillations or could avoid such low-frequency oscillations at the outset.

Instead, modern wind turbines or wind farms nowadays inject into the electrical supply grid by means of frequency converters using a so-called full-power converter concept. Accordingly, the total injected power is injected into the electrical supply grid by the inverter(s) according to precise presets. These presets particularly relate to amplitude, frequency and phase of the injected electrical current, and these presets can be preset via a process control computer. In this case, there is little room for physically dependent reactions or adaptations of the injected current.

In order nevertheless to be able to react to phenomena in the electrical supply grid, in particular in order to be able to react to low-frequency oscillations, i.e., so-called PSO, such oscillations would therefore need to be detected first, ideally on the basis of frequency, phase angle and amplitude. On the basis of this, a desired reaction measure could then be calculated in the process control computer in order for this then to be converted by means of the inverter.

If such a low-frequency oscillation is not detected sufficiently accurately, however, any countermeasures can make the present situation even worse. In this case, such a detection of low-frequency oscillations can be difficult because these low-frequency oscillations first have a comparatively low amplitude of the line frequency, i.e., the 50 Hz or 60 Hz voltage signal in the electrical supply grid, superimposed on them. In particular in the case of the voltage measurement in the electrical supply grid, it also arises that interference and/or noise can be expected. In addition, such low-frequency oscillations generally fluctuate. Particularly, they occur to a weak or strong extent or not at all, depending on the excitation.

Despite these measurement problems, however, a detection which is as quick as possible is desirable. This in turn stands in the way of a longer-term analysis.

There is the additional problem that such low-frequency oscillations can be in a frequency range of 0.05 Hz, or even lower, up to frequency values just below the line frequency, i.e., up to the order of magnitude of 50 to 60 Hz. From a purely physical point of view, the detection of a sinusoidal oscillation requires a measurement over the time period of at least one half-cycle of this oscillation. In the case of a large frequency spectrum, the detection thereof therefore requires a measurement period of at least over one half-cycle of the oscillation at the lowest frequency to be expected.

The German Patent and Trademark Office have searched the following prior art in the priority application relating to the present application: US 2017/0276539 A1.

BRIEF SUMMARY

Provided herein is enabling quick detection of low-frequency oscillations while at the same time making it being possible to detect even very low-frequency oscillations.

A method is proposed. This method serves to detect low-frequency oscillations in an electrical supply grid, in particular to detect subsynchronous resonances in an electrical supply grid. In this case, an electrical supply grid which has a line voltage with a rated line frequency is assumed, wherein the low-frequency oscillations to be detected preferably have a lower frequency than the rated line frequency. In this case, therefore, anything which has a lower frequency than the rated line frequency is in particular referred to and considered as low-frequency oscillation. Preferably, a frequency lower than half the rated line frequency is assumed to be a frequency of the low-frequency oscillations.

In particular, the low-frequency oscillations can have values of 1 Hz or less. However, they can also reach up to five times the value of the rated line frequency. In this case, oscillations with a frequency of a maximum of five times the value of the rated line frequency are referred to as low-frequency oscillations, preferably with a frequency which corresponds to the rated line frequency as a maximum. In particular, the low-frequency oscillation does not have a frequency which corresponds to a multiple of the rated line frequency. It should be noted that the investigation and consideration of low-frequency oscillations particularly serves the investigation or the ensuring of a system stability of the electrical supply grid. This is separate from an assessment of the grid quality or signal quality of the voltage signal on the electrical supply grid, where in particular it is a question of harmonics.

The method proposes recording a first and a second series of measurements, in each case for performing a frequency analysis, in particular for performing a Fast Fourier Transform (FFT).

For this purpose, the performance of a lower frequency analysis for the first series of measurements for a lower frequency range is now proposed, wherein a lower amplitude spectrum is formed for the lower frequency range. In the case of this lower frequency analysis, therefore, the first series of measurements is evaluated, and the evaluation takes place in such a way that it is directed to a lower frequency range. In particular in the case of the use of an FFT, a fundamental or a lowest frequency is preset and at the same time an upper frequency value is established by the used sampling rate, and, as a result, the lower frequency range of the lower frequency analysis can be established. The corresponding sampling rate can also be taken into consideration as early as during the recording, in particular during the measurement, of the respective series of measurements.

In addition, the performance of an upper frequency analysis for the second series of measurements for an upper frequency range is proposed, wherein an upper amplitude spectrum is formed for the upper frequency range. In this case too, the upper frequency range can be established or preset in the same way as the lower frequency range. In both cases, an amplitude spectrum is formed, namely a lower and an upper amplitude spectrum.

In both amplitude spectra, i.e., in the upper and in the lower amplitude spectrum, a test is performed in each case to ascertain whether a low-frequency oscillation component can be identified. When this is the case, the presence of a low-frequency oscillation is assumed. The presence of a low-frequency oscillation is therefore assumed when a low-frequency oscillation component has been identified in at least one of the amplitude spectra. Should at least one low-frequency oscillation component have been identified in both amplitude spectra, the presence of a low-frequency oscillation then naturally also needs to be assumed. Whether this low-frequency oscillation can in this case be additionally identified as a subsynchronous oscillation may be dependent on further information, such as the frequency of the identified low-frequency oscillation component and possibly the electrical supply grid in question. In particular, it is possible that subsynchronous resonances with a known frequency can occur at a grid connection point at which the series of measurements are recorded. This can be known, for example, from a grid analysis or from earlier frequency analyses. Then, when a low-frequency oscillation component has been identified, it is possible to check whether this oscillation component corresponds to a known subsynchronous oscillation to be expected.

The proposed solution is based in particular on the concept that different boundary conditions form or else can form the basis for the measurement for the lower and upper frequency ranges. Thus, the lower frequency range can make a relatively long measurement period, in particular a relatively long measurement window, sensible given a nevertheless lower sampling rate at the same time, whereas a lower measurement period may be sufficient for the higher, i.e., upper frequency range, but a higher sampling rate, i.e., a higher sampling frequency, may be required. If appropriate, this may result in a low-frequency oscillation with a comparatively high frequency being detected more quickly in the upper frequency range than a low-frequency oscillation with a lower frequency is detected for the lower frequency range. However, this is based on the knowledge that it may also be sufficient in the case of the low-frequency oscillation with a low frequency not to detect this oscillation as quickly as a low-frequency oscillation with a higher frequency.

In accordance with one embodiment, it is proposed that the first series of measurements is recorded or is evaluated over a longer time period than the second series of measurements, and that, in addition, or as an alternative, the first series of measurements is recorded or is evaluated at a lower sampling rate than the second series of measurements.

This is based on the knowledge that the different frequency ranges permit different measurement time periods and sampling rates. For the first series of measurements and therefore the lower frequency range, it is possible to measure for a longer period of time because the oscillations to be detected are also slower. In this case, however, it is possible to measure more quickly for the second series of measurements and therefore the upper frequency range in order thus to also arrive at a result more quickly.

At the same time, it has been identified that, in particular in the case of a relatively long measurement given the same sampling rate, correspondingly more measured values would be recorded. However, it has been identified that a lower sampling rate may be sufficient for the analysis of the lower frequency range than for the analysis of the upper frequency range. Therefore, the different time periods or different sampling rates are proposed.

In particular, it is proposed that the first series of measurements is recorded over a first time period, which is in a range of from 1 to 10 minutes. From this, a frequency resolution of from $1/600$ Hz to $1/60$ Hz results from the inverse value.

In addition, or as an alternative, it is proposed that the second series of measurements is recorded over a second time period, which is in a range of from 1 to 10 seconds. In particular, it has also been identified here that although the low-frequency oscillations to be detected are in a frequency range below the rated line frequency, i.e., below 50 Hz or below 60 Hz, nevertheless the frequency range to be investigated, which may be approximately from 0.5 to 50 Hz, for example, includes a very large range. In this case, the greatest frequency to be expected can be of the order of magnitude of approximately 1000 times as great as the lowest frequency to be expected, or even greater. It has also been identified that in particular the first frequency range, which may be, for example, from 0.05 Hz to 0.5 Hz, can make a measurement time period of from 1 to 10 minutes sensible, whereas a measurement time period of several minutes would be very long for the second frequency range, which may be from 0.5 to just 50 Hz, for example, and would permit in particular already many oscillation cycles of a low-frequency oscillation with a comparatively high frequency, such as 10 Hz, for example, before this would be detected. Therefore, such a short second time period of from 1 to 10 seconds is provided for the second series of measurements, i.e., for the detection of the second frequency range.

In accordance with one embodiment, it is proposed that the method is characterized by the fact that a frequency measurement is recorded as the first series of measurements, with the result that the first amplitude spectrum specifies frequency amplitudes depending on a frequency, and that a voltage measurement is recorded as the second series of measurements, with the result that the second amplitude spectrum specifies voltage amplitudes depending on a frequency.

The first amplitude spectrum is therefore a frequency amplitude spectrum, whereas the second amplitude spectrum is a voltage amplitude spectrum. As the first series of measurements, therefore, a frequency is detected, and this can also take place via a voltage measurement, wherein, however, in that case only the frequency characteristic of this voltage measurement is taken into consideration, or the voltage measurement is first converted into a frequency measurement or series of frequency values. Such a series of measurements will have, for example, in the case of a rated line frequency of 50 Hz, a time signal, or a correspondingly discrete signal with a value of approximately 50 Hz. This first series of measurements can be plotted on a graph over a time axis, and this would therefore result substantially in a horizontal line at 50 Hz. However, within this there may be slight deviations if the ideal case is not present. That is to say that this approximately horizontal line at 50 Hz does have some slight oscillations. These therefore indicate fluctuations in the line frequency. If, for example, the line frequency fluctuates from 49.5 Hz to 50.5 Hz and back again within 10 seconds, in order to take a clear example, this corresponds in the frequency amplitude spectrum to a value of the amplitude of 0.5 Hz in the case of a frequency of 0.1 Hz. In a graphical representation, this would therefore be an amplitude of 0.5 Hz on the y axis in the case of a value of 0.1 Hz on the x axis. In the example mentioned, in the frequency amplitude spectrum, an amplitude of 50 Hz, i.e., 50 Hz on the y axis, would be set moreover also in the case of 0 Hz, i.e., in the case of the value 0 on the x axis. This amplitude is namely the value of the fundamental of 50 Hz, which in this case occurs as DC component. The output signal was finally a value of 50 Hz which is substantially constant over time, with small, superimposed fluctuations.

The second series of measurements can in this case be converted, for example, directly, for example via an FFT, into a voltage amplitude spectrum. This voltage amplitude spectrum would correspondingly have the greatest value at 50 Hz, which in the case of the voltage amplitude spectrum represents the fundamental.

Hereby, particularly as a result of the first series of measurements, which is in the form of a frequency measurement, or as a result of the first amplitude spectrum, which is in the form of a frequency amplitude spectrum, effective detection of particularly very low frequencies, which are in particular in a range of below 0.5 Hz, can be achieved. Such a first series of measurements requires, however, a comparatively long measurement in order to be able to record these frequency fluctuations at all in a manner which can be subjected to evaluation. For example, a measurement range of from 1 to 10 minutes is also proposed for this type of first series of measurements.

The second series of measurements can be recorded markedly more quickly, i.e., it can be based on a shorter measurement time period, which may be in the range of from 1 to 10 seconds. Therefore, low-frequency oscillations which nevertheless have a much higher frequency than are contained in the lower frequency range, however, can be detected quickly.

Preferably, a rate or frequency density of the frequency or of a frequency gradient of the frequency is detected for the evaluation of the frequency amplitudes as frequency analysis or part thereof. On the basis of this rate or frequency density, it is then possible for a conclusion to be drawn in respect of a low-frequency oscillation occurring in the series of measurements taken as a basis.

Preferably, it is taken as a basis that the electrical supply grid has a line frequency with a grid period length, wherein it is proposed in this regard that the second series of measurements is recorded for a second measurement time period which is dependent on the line frequency, wherein the second measurement time period is a multiple of the grid period. As a multiple, for example, the second measurement time period can correspond to twice up to five times the grid period. The measurement time period can also be referred to as the measurement window, and the selection of the size of the measurement time period or the measurement window can also be referred to as windowing. As a result, the measurement is also matched to the frequency range in which frequencies are intended to be detected. In this case, in particular a frequency range up to the line frequency is proposed, or up to the rated line frequency, wherein a plurality of periods is in each case completely detected. It is particularly advantageous in this case to detect these periods of the line frequency and therefore the periods of the fundamental signal precisely in order thus to avoid recording a DC component. If appropriate, it may be sufficient here to use the rated line frequency instead of the line frequency because it can be assumed that the line frequency substantially corresponds to the rated line frequency and therefore any errors or DC components remain comparatively small.

In accordance with one embodiment, it is proposed that the first and second series of measurements are recorded in self-repeating loops, and the respective frequency analysis is performed in each loop. As a result, an analysis can also be performed substantially continuously for the respective frequency ranges, and a low-frequency oscillation can be detected correspondingly quickly.

In particular it is proposed that the first series of measurements is recorded in a self-repeating first loop, and the frequency analysis is performed in the first loop, and that the second series of measurements is recorded in a self-repeating second loop, and the frequency analysis is performed in the second loop, wherein the second loop is run more often than the first loop. In particular, the second loop is run at least five times as often as the first loop, preferably at least ten times as often.

This is based in particular on the concept that virtually continuous monitoring and, if appropriate, detection of low-frequency oscillations can be performed. In this case, consideration is taken of the fact that this is performed both for the lower and for the upper frequency ranges, namely by means of the first and second series of measurements, respectively. As has already been explained, the different frequency ranges can result in differently recorded series of measurements and in particular also in series of measurements or measurement durations with different lengths of time. In this regard, it is proposed to assign a dedicated loop to each series of measurements with subsequent frequency analysis, i.e., with subsequent evaluation, with this process of measurement recording and frequency analysis being performed repeatedly in the loops. These loops not only operate independently of one another but are also run at different rates and therefore also at different speeds.

For example, the measurement time period for the first series of measurements can be 60 times as long as the second time period for the second series of measurements. For this, correspondingly the second loop could be run 60 times as often as the first loop, but it has been identified that the recording and evaluation of the second series of measurements, even if it has been recorded in one sixtieth of the time of the first series of measurements, cannot absolutely be evaluated in one sixtieth of the time, however. It is advantageous, however, to allow the second loop to run at least five times as often and therefore as a result also five times as quickly as the first loop or even at least ten times as often and therefore ten times as quickly as the first loop.

Both loops then independently of one another produce measurement results or analysis results, and these also arise at different times which can, if appropriate or occasionally, but do not have to, correspond to every fifth or tenth time, for example. For the total evaluation, it is possible, for example, for in each case the most up-to-date result from each of the two loops, and therefore for each of the two frequency ranges, to be provided for further processing and to then be overwritten in each case with a new up-to-date result or at least for a new result to be provided as soon as it is available. In this case too, it is therefore proposed not to make this result provision simultaneous for both loops or both frequency ranges, but, depending on requirements, and in particular depending on the frequency range from which there is a result. Therefore, subsequent control can always use up-to-date results in a very up-to-date manner, although updating of the analysis results is performed at different times and in particular at different rates for the first and second frequency ranges.

In accordance with one embodiment, it is proposed that the lower frequency range is in the range of from 0 to 5 Hz, preferably in the range of from 0 to 2 Hz, and in particular from 0 to 1 Hz. Therefore, the particularly low-frequency range can be covered and the recording of the first series of measurements followed by frequency analysis can be matched thereto.

In addition, or as an alternative, it is proposed that the upper frequency range is in the range of from 0 Hz to the rated line frequency, in particular in the range of from 0.5 Hz to the rated line frequency. In this case, the upper frequency range is directed to this high frequency range of the total range of the low-frequency oscillations to be expected. It may in particular also be expedient to have a region of overlap between the lower and upper frequency ranges. In the case of the proposal that the upper frequency range begins at 0.5 Hz, even in the case of the smallest proposed range for the lower frequency range of 0 to 1 Hz, a slight region of overlap still results. This in particular avoids a situation whereby low-frequency oscillations with a frequency precisely in this limit range between the lower and the upper frequency range are detected insufficiently. In principle, the upper frequency range of from 0 Hz to the rated line frequency can also be provided, wherein, in the case of the very low frequencies, it is accepted that the measured value detection is not ideal and detects for very low frequencies of less than one half-cycle. In the case of higher frequencies, for example above 0.5 Hz, however, as far as possible, the measurement window, i.e., the measurement time period, should then at least include one half-cycle.

In accordance with one embodiment, it is proposed that the recording of the series of measurements takes place at a measurement point which is arranged on a wind turbine connected to the electrical supply grid and/or which is arranged in a wind farm connected to the electrical supply grid. Provision is therefore made for the measurement to take place as a result at the wind turbine or in the wind farm. There, the evaluation can also be performed, and the result is therefore information on low-frequency oscillations which are relevant to the wind turbine or the wind farm. In particular, they occur there at the grid connection point into which the wind turbine or the wind farm injects current.

In principle, it is also possible for the measurement point to be arranged both at the wind turbine and in the wind farm when this wind turbine, which has the measurement point, is namely part of a wind farm. Therefore, the results of the method for detecting low-frequency oscillations can be present directly at the wind turbine or the wind farm and can also be used directly there in order to, on the basis of these results, to inject active electrical power and/or reactive electrical power in such a manner as to damp the detected oscillations.

It is preferably proposed to inject an active power component and/or a reactive power component with a frequency which corresponds to a frequency of an identified low-frequency oscillation component depending on the detected low-frequency oscillations.

Preferably, it is proposed that the recording of the series of measurements takes place in such a way that a voltage is detected at a grid connection point at which the wind turbine or the wind farm injects into the electrical supply grid. It is also possible for a variable which is equivalent thereto to be detected. In particular, the voltage at the grid connection point can give an indication of low-frequency oscillations on the electrical supply grid, to be precise in particular for a section of the electrical supply grid which is relevant to the wind turbine or the wind farm. Therefore, a voltage detected there and therefore low-frequency oscillation detected there can form a basis for oscillation-damping measures by the wind turbine or the wind farm.

A variable which is equivalent to the voltage at the grid connection point may also be a voltage on a low-voltage side of a transformer when its high-voltage site is connected to the grid connection point. The voltage at an inverter output of a wind turbine or a wind farm can also be a variable which is equivalent to the voltage at the grid connection point of the same wind turbine or the same wind farm. Particular attention needs to be paid here to the fact that it is not absolutely an accurate recording of the voltage at the grid connection point, but rather detection of low-frequency oscillations. In particular the frequency of such a low-frequency oscillation will hardly change owing to transmission elements between an inverter output and a grid connection point. In any case, the amplitude and the phase angle could change. Such a change in amplitude and phase angle, depending on frequency, can be known for a transmission path, however, and, if appropriate, taken out of the equation.

Therefore, the recording of the series of measurements which takes place in such a way that a voltage is detected at a grid connection point can also take place by recording of the series of measurements at a measurement point on the wind turbine or in the wind farm.

In accordance with one embodiment, it is proposed that further steps are provided, namely recording at least one further series of measurements, performing in each case one further frequency analysis for the at least one further series of measurements in each case for a further frequency range, wherein in each case one further amplitude spectrum is formed for the further frequency range, and testing whether a low-frequency oscillation component can be identified in the respective further amplitude spectrum, wherein the presence of a low-frequency oscillation is assumed when a low-frequency oscillation component has been identified in at least one of the amplitude spectra.

It has been identified that the previously proposed division into two frequency ranges, namely the lower frequency range and the upper frequency range, and for this the recording of a first and second series of measurements can be extended to a third frequency range and accordingly also to further frequency ranges. Correspondingly, a third series of measurements, or even further series of measurements, is recorded and in each case a frequency analysis is performed. As a result, the measurement time period, i.e., the measurement window and therein the sampling rate, can in particular be preset in a targeted manner for the respective frequency ranges in order to look for low-frequency oscillations in a targeted manner in precisely the frequency range by virtue of a corresponding frequency analysis being performed in a targeted manner there.

Correspondingly, the at least one further frequency range is also one which corresponds to a frequency range for low-frequency oscillations, in particular reaches up to the rated line frequency or is below this. For example, provision can be made for only one further frequency range to be selected which, to this extent, can also be referred to as the third frequency range, and for this frequency range to be introduced between the lower and the upper frequency ranges. Preferably, the lower frequency range can then range from 0 to 0.5 Hz, the third frequency range from 0.5 Hz to 5 Hz, and the second frequency range from 5 to 50 Hz. It is also possible for overlaps to be provided, and in this sense, it is also possible for yet further frequency ranges to be introduced and accordingly used for the analysis and evaluation.

In particular, the presence of a low-frequency oscillation can be assumed when a low-frequency oscillation component is identified in only one of the frequency ranges, i.e., in only one of the amplitude spectra.

Preferably, different evaluation methods, in particular different frequency analyses, are provided for different series of measurements, in particular a dedicated evaluation method, in particular dedicated frequency analysis, is provided for each series of measurements. In particular, it is proposed in addition to select the evaluation method in each case from the following possibilities:

FFT of a voltage signal,
FFT of a frequency characteristic, and
wavelet analysis.

It has been identified here in particular that different frequency ranges form the basis in the different series of measurements, and that different types of oscillations can occur in the different frequency ranges, and in particular different types of oscillations are to be expected, to which the frequency analysis is adapted as well in terms of nature.

A wind power system is also proposed. Such a wind power system is understood here as a generic term and relates either to a wind turbine or a wind farm comprising a plurality of wind turbines. This system is provided for detecting low-frequency oscillations, in particular for detecting subsynchronous resonances, namely in an electrical supply grid. In this case it is assumed that the electrical supply grid is an electrical supply grid which has a line voltage with a rated line frequency, and that the low-frequency oscillations to be detected have a lower frequency than the rated line frequency, in particular at most half the frequency of the rated line frequency. The wind power system comprises a recording device for recording a first and a second series of measurements, in each case for performing a frequency analysis, in particular for performing an FFT. For this purpose, the recording device can include in particular a voltage measurement means or can be coupled to such a voltage measurement means in order to record voltage values in a presettable measurement time period and with a presettable sampling rate or sampling frequency. By virtue of such a type of recording of the first and second series of measurements, these series of measurements can be prepared for the performance of a frequency analysis.

In addition, at least one first and second frequency analyzer is provided. The first frequency analyzer is provided for performing a lower frequency analysis for the first series of measurements for a lower frequency range, wherein a lower amplitude spectrum is formed for the lower frequency range. The second frequency analyzer is provided for performing an upper frequency analysis for the second series of measurements for an upper frequency range, wherein an upper amplitude spectrum is formed for the upper frequency range. Therefore, for each series of measurements, i.e., at least the first and the second series of measurements, if appropriate for a third or further series of measurements, the frequency analysis is performed by the respective frequency analyzer. It should be noted in particular here that in each case individual boundary conditions form the basis of the first and second frequency analyzers, or generally each of the frequency analyzers, in particular different time windows, namely measurement windows and sampling rates, which can be preset partially by the respectively recorded series of measurements.

The first and second frequency analyzers can each be provided as process control computer in order to perform the frequency analysis. For this purpose, each frequency analyzer can be given its respective series of measurements. However, it is also possible for the frequency analyzers to be combined or consolidated in one process control computer and, if appropriate, to form part of a process control computer of the wind turbine or the wind farm, which in addition performs further analysis and/or control tasks and can generate and output, for example, control signals to an inverter. For this purpose, each frequency analyzer can be formed in the process control computer also as a computer program or analysis block and can be implemented there in order to evaluate the respective series of measurements in each case.

In any case, however, the frequency analyzers, i.e., at least the first and second frequency analyzers, operate separately from one another. In particular, they can also be implemented in different program loops and are called up at different rates in these program loops, with the result that, in particular, the first frequency analyzer is run more seldom than the second frequency analyzer.

In addition, a first test unit and a second test unit are provided, if appropriate further test units. The first test unit is provided for testing whether a low-frequency oscillation component can be identified in the lower amplitude spectrum, wherein the second test unit is provided for testing whether a low-frequency oscillation component can be identified in the upper amplitude spectrum. Therefore, a separate test is performed for both amplitude spectra, namely the lower and the upper amplitude spectrum, to ascertain whether there is a low-frequency oscillation component. Each test unit can be in the form of an independent physical device, or the test units can be consolidated to form one unit and therein each operate independently. In particular, a process control computer can be provided for this purpose. The test units can also be contained in an already existing process control computer (or controller), or in a process control computer which performs other tasks. In particular, the test units can also be in the form of software program or program units or can be implemented in a process control computer.

In addition, an evaluation device is proposed for evaluating whether there is a low-frequency oscillation. In this case, the presence of a low-frequency oscillation is assumed when a low-frequency oscillation component has been identified in the lower and/or upper amplitude spectrum or in a further amplitude spectrum. The evaluation unit can also be implemented as a dedicated unit or as a software solution in an existing process control computer. The evaluation unit in this case assesses the results for both frequency ranges or, if appropriate, for yet further frequency ranges. To this extent, it combines the individual results of the individual frequency ranges, which are therefore based on the respective series of measurements. As a result, the frequency ranges and therefore the individual series of measurements can be assessed and evaluated or else recorded individually as described, and then a consolidation of the results can be performed by the evaluation device.

In accordance with one embodiment, it is proposed that the wind power system has an installation control device (controller), and the installation control device is set up to implement a method in accordance with one of the above-described embodiments. In particular, for this purpose, such a method can be implemented in the installation control device. The installation control device may be a wind turbine control device if the wind power system is a wind turbine. If the wind power system is a wind farm, the installation control device can be a central farm control device (controller).

In accordance with one embodiment, it is proposed that the wind power system is characterized by the fact that a first process loop is provided, and the first process loop is designed to be run repeatedly, wherein, on each run, the first series of measurements is recorded, the lower frequency analysis is performed, a lower amplitude spectrum is formed, and a test is performed to ascertain whether a low-frequency oscillation component can be identified in the lower amplitude spectrum, a second process loop is provided, and the second process loop is designed to be run repeatedly, wherein, on each run, the second series of measurements is recorded, the upper frequency analysis is performed, an upper amplitude spectrum is formed, and a test is performed to ascertain whether a low-frequency oscillation component can be identified in the upper amplitude spectrum, wherein the first and second process loops are matched to one another in such a way or have such a relationship to one another that the second process loop is run more often than the first process loop, in particular that the second process loop is run at least five times as often as the first process loop, in particular ten times as often.

Therefore, two different process loops are provided, which each perform the recording of the series of measurements, the performance of the respective frequency analysis and, in this case, the formation of the respective amplitude spectrum, and finally also in each case test whether a low-frequency oscillation component can be identified. As a result, two independent process loops can also process the respective different series of measurements and therefore different frequency ranges correspondingly in a targeted manner. In particular, these two process loops are independent of one another to the extent that they can be run independently of one another, namely at different rates. If the two process loops can be incorporated in a total process, however, in particular implemented in the installation control, more frequent running of the second process loop is achieved, in particular is achieved by the installation control device.

BRIEF DESCRIPTION OF THE SEVERAL VIEWS OF THE DRAWINGS

The invention will now be explained in more detail below using exemplary embodiments by way of example with reference to the attached figures.

DETAILED DESCRIPTION

Figure 1:
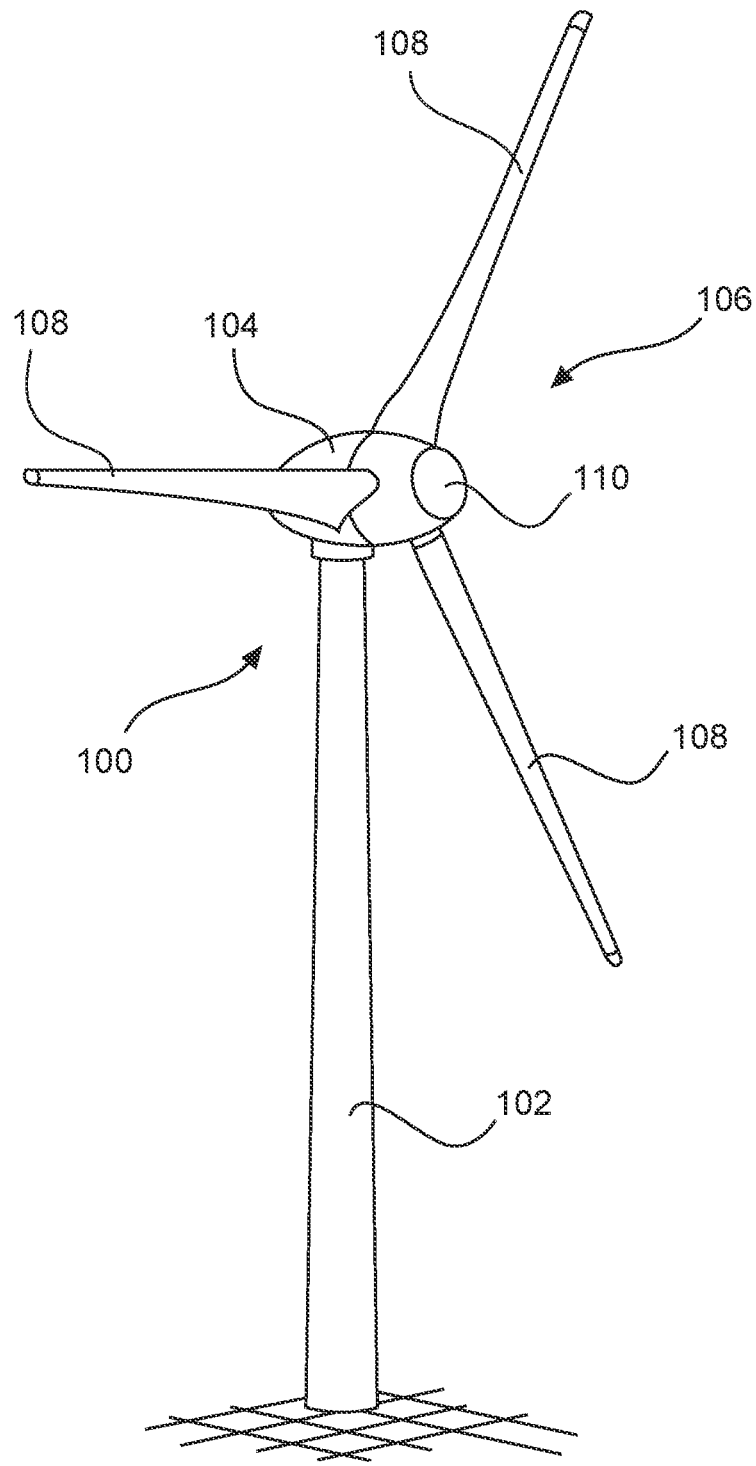
FIG. 1 shows a wind turbine in a perspective illustration.

FIG. 1 shows a wind turbine 100 comprising a tower 102 and a nacelle 104. A rotor 106 comprising three rotor blades 108 and a spinner 110 is arranged on the nacelle 104. The rotor 106 is set in rotary motion by the wind during operation and thereby drives a generator in the nacelle 104.

Figure 2:
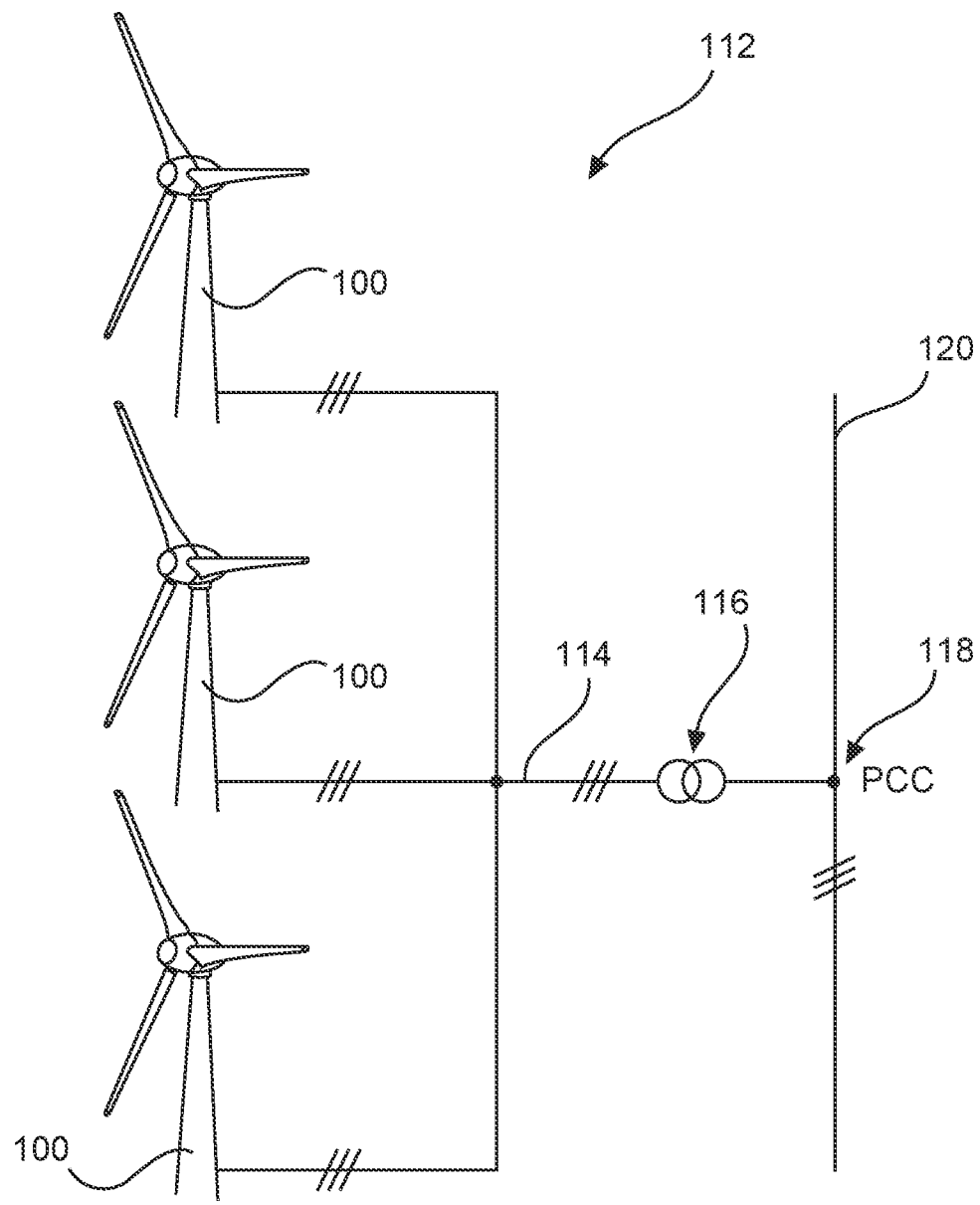
FIG. 2 shows a wind farm in a schematic illustration.

FIG. 2 shows a wind farm 112 comprising, by way of example, three wind turbines 100, which may be identical or different. The three wind turbines 100 are therefore representative of, in principle, any desired number of wind turbines in a wind farm 112. The wind turbines 100 provide their power, namely in particular the generated current, over an electrical farm grid 114. In this case, the respectively generated currents or powers of the individual wind turbines 100 are added, and usually a transformer 116 is provided, which steps up the voltage in the farm in order to then inject this into the supply grid 120 at the injection point 118, which is also referred to as the PCC. FIG. 2 is merely a simplified illustration of a wind farm 112, which does not show any control, for example, although naturally control is provided. For example, the farm grid 114 can also be configured differently by virtue of, for example, a transformer also being provided at the output of each wind turbine 100, to name but one other exemplary embodiment.

Figure 3:
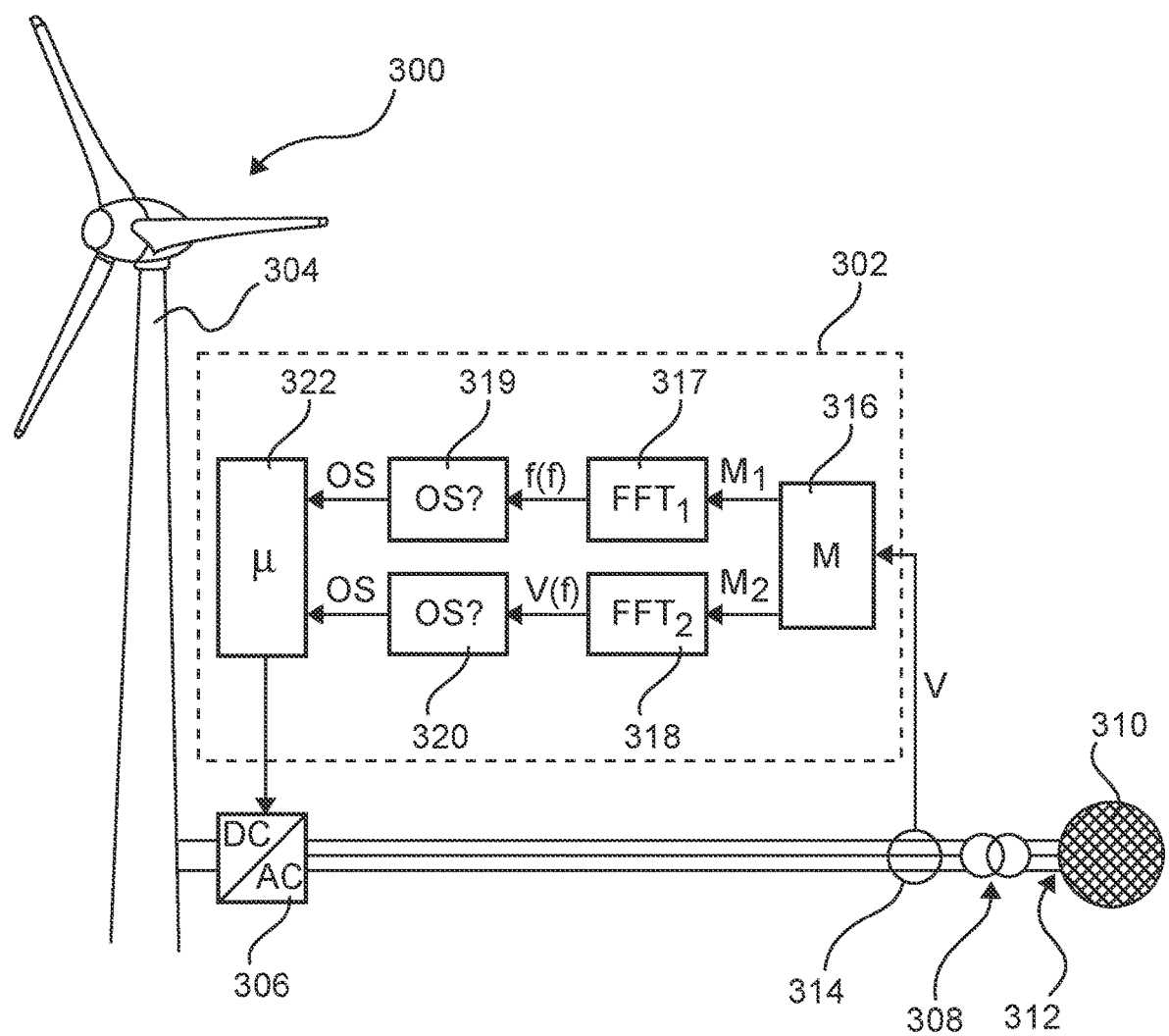
FIG. 3 shows an installation control device of a wind turbine or a wind farm in a schematic illustration.

FIG. 3 shows a schematic illustration of a wind turbine 300, which can also correspond to a wind turbine 100 as shown in FIG. 1 or FIG. 2 and which moreover may also be representative of another wind power system, in particular a wind farm. This wind turbine 300 comprises an installation control device (controller) 302, which is shown here outside the actual wind turbine 300 for reasons of clearer illustration but could be accommodated in the wind turbine tower 304, for example. The installation control device 302 can drive, for example, an inverter 306, which can generate a three-phase output current and inject this current into an electrical supply grid 310 via a transformer 308. A grid connection point 312 can be provided between the transformer 308 and the electrical supply grid 310.

In order to detect low-frequency oscillations, an electrical voltage is detected by means of a measuring sensor (voltmeter or multimeter) 314 and input into the installation control device 302. The detected electrical voltage V substantially corresponds to an electrical voltage on the electrical supply grid 310, in particular at the grid connection point 312, wherein a transformation ratio of the transformer 308 needs to be taken into consideration.

A recording device (memory) 316, which receives the voltage signal V from the measuring sensor 314, is provided in the installation control device 302. The recording device 316 can then record a first and second series of measurements from this voltage signal V. For this purpose, in each case a different time window and also a different sampling rate can be provided for the two series of measurements. The recording device 316 can also in particular perform a further conversion or conditioning for the first series of measurements, after which a time-dependent frequency signal is generated as the first series of measurements. Accordingly, the first series of measurements M1 can be in the form of a time-dependent frequency signal f(t), whereas the second series of measurements can be in the form of a time-dependent voltage signal V(t). This is proposed in any case in accordance with the variant shown in FIG. 3. Preferably, already these first and second series of measurements nevertheless form standardized variables in order to be able to be further-processed more effectively in a process control computer.

The first series of measurements is then input into the first frequency analyzer 317, and this first frequency analyzer 317 performs a frequency analysis, namely an FFT, which outputs a lower amplitude spectrum as the result, namely a frequency amplitude spectrum f(f). This frequency amplitude spectrum f(f) therefore forms a lower amplitude spectrum and is input into the first test unit 319. This first test unit 319 tests whether a low-frequency oscillation component can be identified in this lower amplitude spectrum, i.e., the frequency amplitude spectrum f(f), and the result of one or more oscillations detected in the process is passed on to the evaluation device 322. Such information on any detected low-frequency oscillations can include, in particular, amplitude, frequency and phase of the detected low-frequency oscillations, at least frequency and amplitude.

Similarly, the second series of measurements M2, which is in the form of a time-dependent voltage signal, is passed on to the second frequency analyzer 318. The second frequency analyzer 318 performs a frequency analysis, namely an FFT, and the result is an upper amplitude spectrum, namely a voltage amplitude spectrum V(f). This voltage amplitude spectrum V(f) is passed on to the second test unit 320, and said second test unit then tests for this upper amplitude spectrum whether a low-frequency oscillation component can be identified. Such a low-frequency oscillation component, which accordingly also applies for the lower amplitude spectrum, can also be referred to in simplified form as a low-frequency oscillation or low-frequency oscillation signal. The result is then passed from the second test unit 320 likewise to the evaluation device 322. The evaluation device 322 then consolidates the results of the two analyses, i.e., also of both series of measurements, and can therefore overall make an assessment as to whether there is a low-frequency oscillation. A low-frequency oscillation is assumed when a low-frequency oscillation component has been identified at least in one of the two investigated amplitude spectra, i.e., in the lower amplitude spectrum or in the upper amplitude spectrum, or in both amplitude spectra.

If appropriate, the evaluation device 322 can then react to this and pass on a corresponding signal to the inverter 306 for compensation or at least oscillation damping.

All of the elements shown in the installation control device 302, i.e., in particular the recording device 316, the two frequency analyzers 317 and 318, the two test units 319 and 320 and also the evaluation device 322 can also be implemented in a common process control computer. If appropriate, for this purpose, an analog-to-digital converter, or a plurality of analog-to-digital converters, can be provided in the recording device 316 in order to generate the first and second series of measurements from the recorded voltage measurement.

Figure 4:
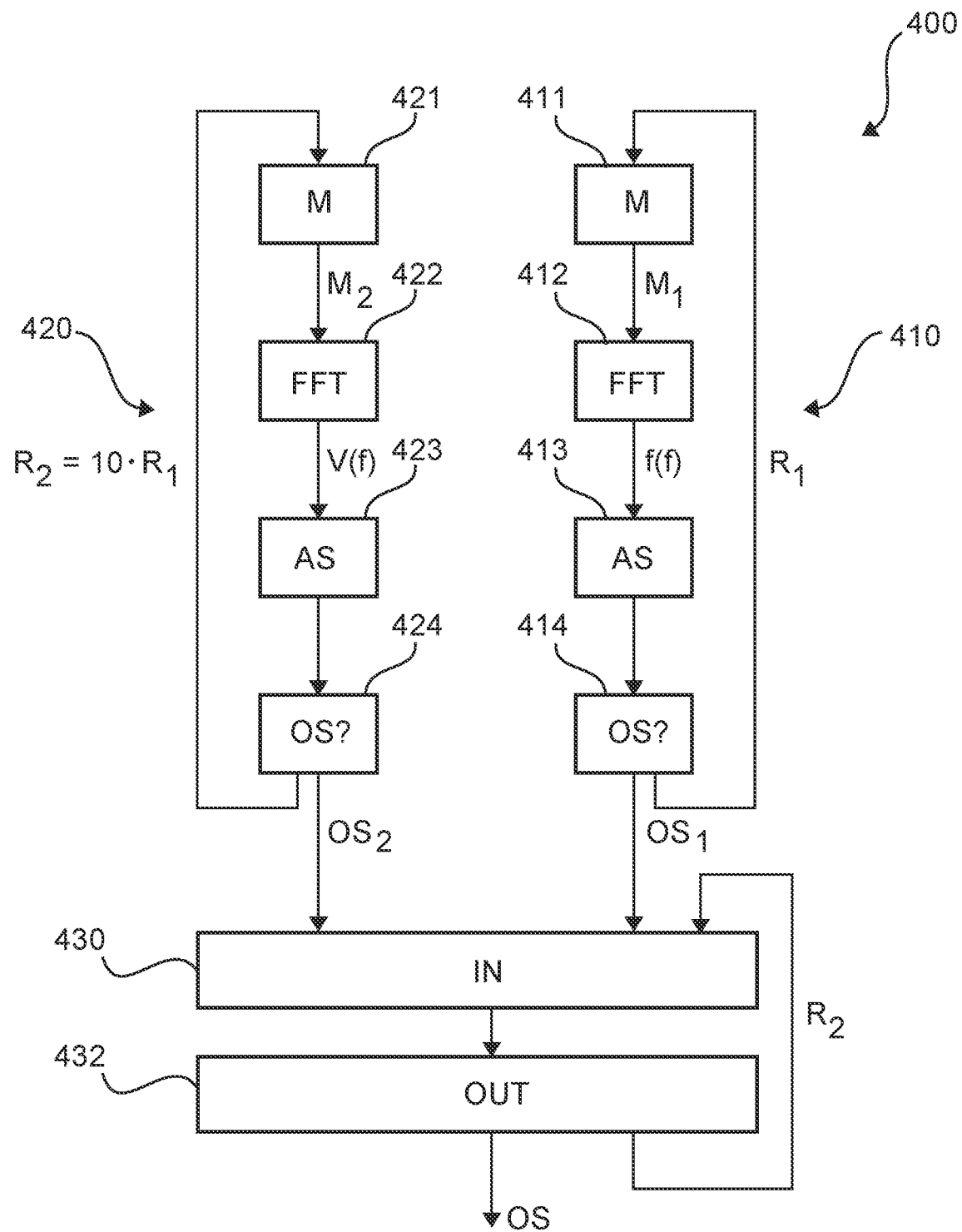
FIG. 4 describes a flowchart of a method for detecting low-frequency oscillations.

FIG. 4 shows, schematically, a flowchart 400 of a method for detecting low-frequency oscillations. This flowchart 400 shows a first process loop 410 and a second process loop 420. The two process loops 410, 420 operate independently and can also be run asynchronously with respect to one another but have many similar elements. The first process loop is provided for evaluating a lower frequency range. It performs the recording of a first series of measurements in the recording block 411. The result is therefore the first series of measurements M1, and the latter is then analyzed in terms of its frequency in the frequency analysis block 412, and the result is a frequency amplitude spectrum f(f), which can be further illustrated or evaluated as amplitude spectrum in the amplitude spectrum block 413. On the basis of this, a test is then performed in the test block 414. In this case, a test is performed to ascertain whether a low-frequency oscillation, or a low-frequency oscillation component, can be identified in the amplitude spectrum. The result of this test can be output from the test block 414 to the evaluation block 430 as OS1 signal.

Once this first process loop 410 has been run, the process sequence returns at the end of test block 414 to the recording block 411. This can take place with a first repetition rate R1. This first repetition rate R1 may be, for example, one repetition per minute.

The second process loop 420 is similar to the first process loop 410 but operates independently therefrom. The second process loop 420 also has a recording block 421, in which a second series of measurements is recorded in order then for an upper frequency range to be evaluated in this second process loop 420. Therefore, the second series of measurements M2 is generated in the recording block 41, and this second series of measurements is further-processed in the frequency analysis block 422. There, namely, a frequency analysis is performed, and the result is a frequency-dependent voltage signal V(f), which can be further evaluated in the amplitude spectrum block 423. There, namely, an amplitude spectrum can be set up or further prepared.

The second process loop 420 then continues in the test block 424 and tests there, in the amplitude spectrum, whether a low-frequency oscillation can be identified or whether a low-frequency oscillation component can be identified. The result can be passed on, as second low-frequency oscillation OS2, to the evaluation block 430.

The second process loop 420 is then, however, continued, after execution of the test block 424, again from the beginning in the recording block 421 and repeated. This second process loop 420 can in this case be run with a second repetition rate R2. The second repetition rate R2 is in this case greater than the first repetition rate R1 of the first process loop 410. For example, the second repetition rate R2 can be ten times as great as the first repetition rate R1. In the mentioned example, therefore, the second repetition rate R2 is then ten repetitions per minute. The first process loop 410 is therefore run once a minute, whereas the second process loop 420 is run once every 6 seconds.

It is also possible to operate the two process loops in synchronism. In this case, for example, once the first process loop has been run, there is a wait time until the last run of the second process loop, and the two process loops are then started in synchronism.

Therefore, the evaluation block 430 receives a second oscillation signal OS2 from the second process loop 420 ten times as often as it receives a first oscillation signal OS1 from the first process loop. For this purpose, the evaluation block 430 can receive and buffer-store these two signals at different rates. Up-to-date values of the first and second oscillation signals OS1, OS2 in each case result in a total evaluation which is output by means of the result block 432. The result block 432 can also be understood as being part of the evaluation block 430.

It is now proposed that the processes of the evaluation block 430 and the result block 432 are likewise repeated, wherein, as repetition, the second repetition rate R2 is also proposed in order that in each case the up-to-date values of the second process loop 420 can always be evaluated in an up-to-date manner. With each repetition, the evaluation block 430 receives an up-to-date second oscillation signal OS2 from the second process loop 420, namely its test block 424, but in order to keep to the example, an up-to-date first oscillation signal OS1 only every tenth repetition.

This is consciously accepted, and the evaluation in evaluation block 430 therefore takes place in each case with the up-to-date second oscillation signal OS2 and the first oscillation signal OS1 still provided in each case, which therefore, illustratively speaking, is an old signal in 9 out of 10 runs. However, this does not impair the process since a change is also to be expected much more seldom or slower for the first oscillation signal OS1.

The result block 432 can nevertheless output a total result as total oscillation signal OS for the high repetition rate, namely the second repetition rate R2.

One possible variant is to record an FFT of the line voltage Vas frequency analysis. This can be performed for the upper and the lower frequency ranges, i.e., for a first and a second series of measurements. The recorded line voltage V then forms in each case the first and second series of measurements. The result is a voltage spectrum, of which an example is given in FIG. 5. The example in FIG. 5 is based on an electrical supply grid with a rated frequency of 50 Hz, which in this case is also approximately the dominant frequency.

Figure 5:
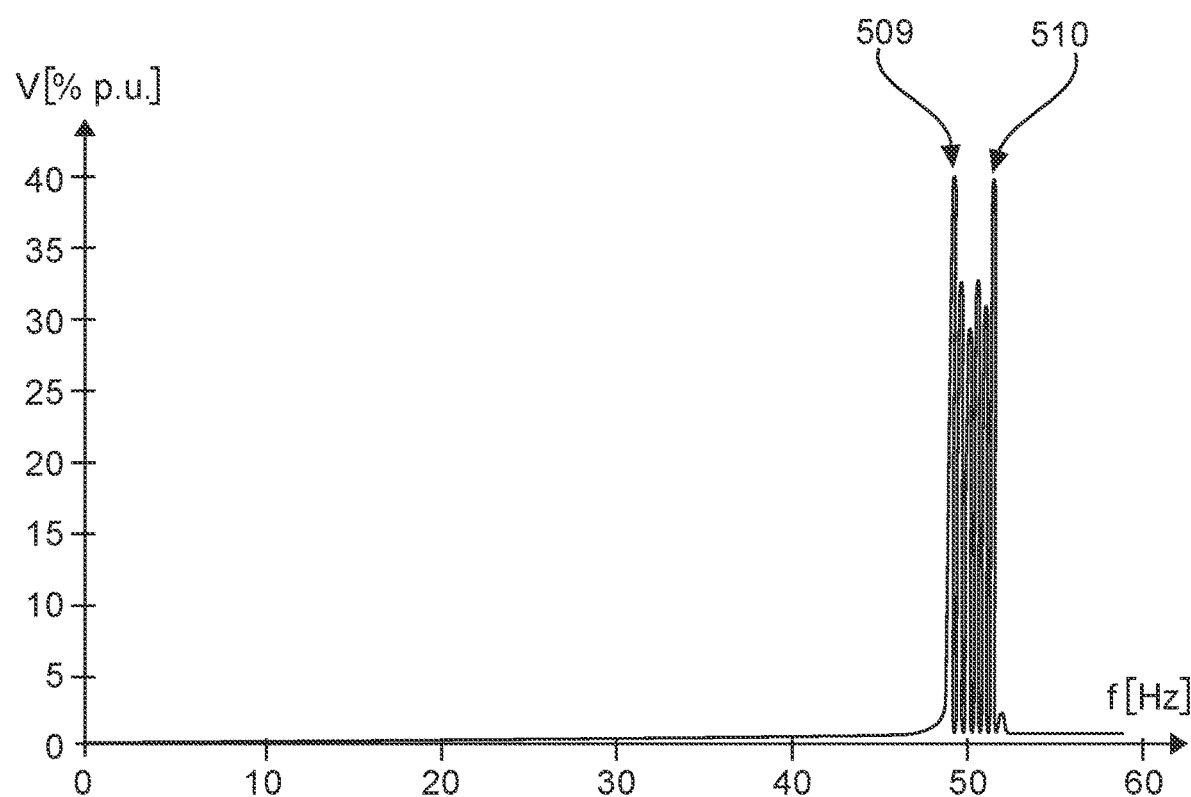
FIG. 5 shows a voltage spectrum of a line voltage illustratively in a graph.

In particular, it can be seen in the voltage spectrum in FIG. 5 that said voltage spectrum is substantially grouped around the value of 50 Hz. In this case, however, there is no singular rate maximum value precisely at 50 Hz, i.e., precisely at the rated frequency or dominant frequency, but rather here there are two local maximum values 509 and 510 flanking the rated frequency or dominant frequency. In order to estimate a low-frequency oscillation component, these two local maxima or local maximum values can be evaluated and their amplitude and/or amplitude increase can give an indication of whether a low-frequency oscillation or a low-frequency oscillation component is present.

Yet a further variant, which can also be combined with the previously described variants, consists in the evaluation of a fluctuation spectrum. This is proposed in particular as evaluation of the first series of measurements, i.e., for analysis of a lower frequency range. For illustrative purposes, FIG. 6 contains three graphs A to C in this regard.

The first graph A illustrates a voltage characteristic, for example at the grid connection point 118 shown in FIG. 2. This voltage characteristic should be understood schematically and is intended to symbolize, for example, a sinusoidal characteristic with fluctuating frequencies. The voltage curve 600 therefore has, in exaggerated fashion, periods of different lengths. The voltage curve 600 is therefore reminiscent of an accordion. In any case, the intention is for it to be illustrated here that this voltage curve 600 fluctuates in terms of its sinusoidal characteristics over time t. The time t is plotted in graph A from 0 to 15 seconds. In this time, the voltage curve 600 changes back and forth approximately two and a half times between the long and short period. Its frequency therefore fluctuates approximately two and a half times back and forth in these 15 seconds.

This can be illustrated as a frequency characteristic over time, which is illustrated in graph B. Graph B therefore shows a frequency curve 602 over time. It is assumed that, without any fluctuation in frequency, a fixed frequency of 50 Hz has been set. To this extent it will be repeated once again that graph A is illustrative. In fact, apart from the fluctuations, a signal with approximately 1 Hz is shown in graph A. It is nevertheless assumed that the signal has a fundamental of 50 Hz, and to this extent graph A is intended to symbolize only a 50 Hz signal with the approximately sinusoidal waveforms.

In any case, it can be seen in graph B that the frequency curve 602 oscillates around this dominant frequency of 50 Hz.

This oscillating signal, i.e., this oscillating frequency curve 602, can now be evaluated as a spectrum. Since in graph B, the frequency is investigated depending on time, a frequency depending on a frequency results in the case of transfer into a spectrum.

Graph C shows this associated frequency spectrum. In graph C, therefore, the frequency is plotted in Hz over the frequency in Hz. This results in a value according to the x axis at 0 Hz, and the amplitude there is 50 Hz. The fundamental oscillation therefore has an amplitude of 50 Hz, and it does not change and is therefore at 0 Hz. In addition, the frequency curve 602 in graph B fluctuates, but around this 50 Hz value. This fluctuation is such that it fluctuates from 49 to 51 Hz. The fluctuation amplitude is therefore 1 Hz. In addition, it fluctuates to and fro twice in 10 seconds, with the result that a frequency of 0.2 Hz results. This fluctuation in the frequency curve 602 in graph B is therefore a value with the amplitude 1 Hz at a frequency of 0.2 Hz in the spectral illustration in graph C.

Figure 6:
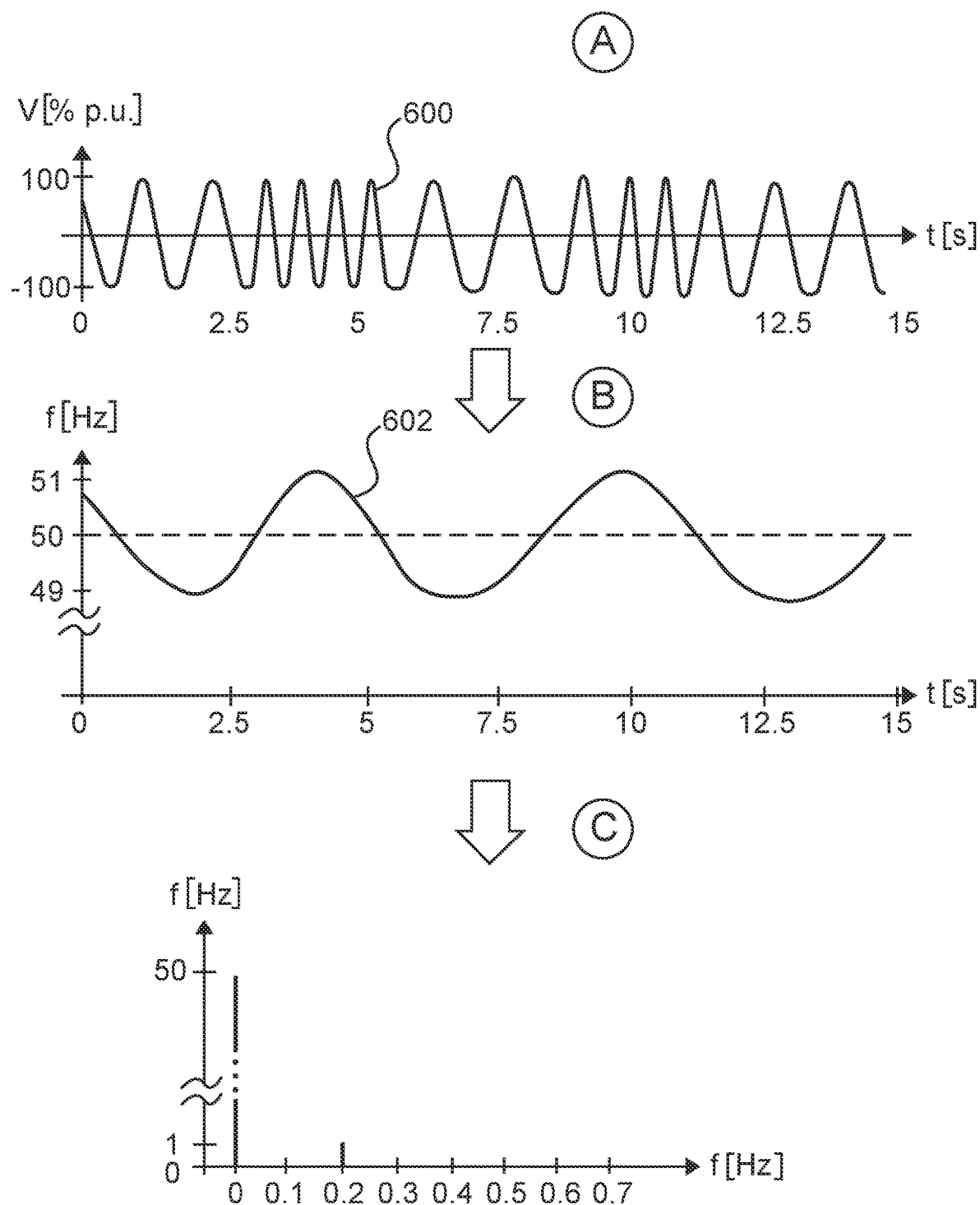
FIG. 6 shows three graphs for illustrating a fluctuation spectrum.

To this extent, this investigation of the fluctuation spectrum is also a low-frequency investigation. Graph C in FIG. 6 should, however, likewise only be understood illustratively and, in principle, with such an investigation of the fluctuation spectrum not only a single spectral value should be expected, but several spectral values. In any case, a low-frequency oscillation can be detected from such spectral values of the frequency spectrum illustrated in graph C. The fluctuation amplitude of the signal in FIG. 6 is 1 Hz and its value is 0.2 Hz in accordance with the illustration in graph C.

The invention claimed is:

1. A method for detecting low-frequency oscillations in an electrical supply grid having a line voltage and a rated line frequency, comprising:
  recording a first series of measurements and a second series of measurements;
  performing a first frequency analysis on the first series of measurements for a lower frequency range and determining a first amplitude spectrum for the lower frequency range;
  performing a second frequency analysis on the second series of measurements for an upper frequency range and determining a second amplitude spectrum for the upper frequency range;
  determining whether the first amplitude spectrum has a first low-frequency oscillation component;
  determining whether the second amplitude spectrum has a second low-frequency oscillation component; and detecting a presence of a low-frequency oscillation in response to at least one of:
   determining that the first amplitude spectrum has the first low-frequency oscillation component, and
   determining that the second amplitude spectrum has the second low-frequency oscillation component,
wherein the low-frequency oscillation has a lower frequency than the rated line frequency, and
wherein:
   the first and second series of measurements are recorded repeatedly and in self-repeating loops, and first and second frequency analyses are performed repeatedly,
   a first loop includes recording the first series of measurements and performing the first frequency analysis,
   a second loop includes recording the second series of measurements and performing the second frequency analysis, and
   the second loop is run more frequently than the first loop.

2. The method as claimed in claim 1, wherein:
the first series of measurements is recorded or evaluated by performing the first frequency analysis over a longer time period than the second series of measurements; and/or
the first series of measurements is recorded or evaluated by performing the first frequency analysis at a lower sampling rate than the second series of measurements.

3. The method as claimed in claim 1, wherein:
the first series of measurements is recorded over a first time period in a range of 1 to 10 minutes; and/or
the second series of measurements is recorded over a second time period in a range of 1 to 10 seconds.

4. The method as claimed in claim 1, comprising:
recording frequency measurements as the first series of measurements, wherein the first amplitude spectrum specifies frequency amplitudes in relation to frequency; and
recording voltage measurements as the second series of measurements, wherein the second amplitude spectrum specifies voltage amplitudes in relation to frequency.

5. The method as claimed in claim 4, wherein performing the first frequency analysis includes determining a rate or frequency density of the frequency measurements or of a frequency gradient of the frequency measurements.

6. The method as claimed in claim 1, wherein:
the electrical supply grid has a line frequency and a grid period; and
the second series of measurements is recorded for a second measurement time period which is dependent on the line frequency, wherein the second measurement time period is a multiple of the grid period.

7. The method as claimed in claim 1, wherein:
the lower frequency range is from 0 to 5 Hz; and/or
the upper frequency range is from 0 Hz to the rated line frequency.

8. The method as claimed in claim 7, wherein:
the lower frequency range is from 0 to 1 Hz; and/or
the upper frequency range is from 0.5 Hz to the rated line frequency.

9. The method as claimed in claim 1, wherein:
the first and second series of measurements are recorded at a measurement point, and
the measurement point is arranged in a wind turbine connected to the electrical supply grid, the measurement point is arranged in a wind farm connected to the electrical supply grid, and/or recording of the first and second series of measurements is performed such that a voltage or a quantity representative of the voltage is detected at a grid connection point at which the wind turbine or the wind farm feeds into the electrical supply grid.

10. The method as claimed in claim 1, comprising:
recording at least one further series of measurements;
performing, for each at least one further series of measurements, a respective further frequency analysis for a respective further frequency range and forming a respective further amplitude spectrum for the respective further frequency range;
determining whether the further amplitude spectrum has a respective low-frequency oscillation component; and
detecting the presence of the low-frequency oscillation in response to determining that the respective low-frequency oscillation component is detected in at least one of the further amplitude spectra.

11. The method as claimed in claim 1, wherein the low-frequency oscillations are subsynchronous resonances.

12. The method as claimed in claim 1, wherein the first frequency analysis and the second frequency analysis are fast Fourier transforms (FFTs).

13. The method as claimed in claim 1, wherein the second loop is run at least 5 times as often as the first loop.

14. The method as claimed in claim 1, wherein the second loop is run at least 10 times as often as the first loop.

15. The method as claimed in claim 1, wherein the first low-frequency oscillation component in the first amplitude spectrum and the second low-frequency oscillation component in the second amplitude spectrum have a frequency of one hertz (Hz) or less.

16. A wind power system for detecting low-frequency oscillations in an electrical supply grid having a line voltage and a rated line frequency, the wind power system comprising:
   a controller configured to:
      record a first series of measurements and a second series of measurements;
      perform a first frequency analysis on the first series of measurements for a lower frequency range and determine a first amplitude spectrum for the lower frequency range;
      perform a second frequency analysis on the second series of measurements for an upper frequency range and determine a second amplitude spectrum for the upper frequency range;
      determine whether the first amplitude spectrum has a first low-frequency oscillation component;
      determine whether the second amplitude spectrum has a second low-frequency oscillation component; and
      detect a presence of a low-frequency oscillation in response to at least one of:
         determining that the first amplitude spectrum has the first low-frequency oscillation component, and
         determining that the second amplitude spectrum has the second low-frequency oscillation component,
      wherein the low-frequency oscillation has a lower frequency than the rated line frequency, and
      wherein:
         the controller is configured to repeatedly run a first process loop, wherein the first process loop includes recording the first series of measurements, performing the first frequency analysis, determining the first amplitude spectrum, and determining whether the first amplitude spectrum has the first low-frequency oscillation component, the controller is configured to repeatedly run a second process loop, wherein the second process loop includes recording the second series of measurements, performing the second frequency analysis, determining the second amplitude spectrum, and determining whether the second amplitude spectrum has the second low-frequency oscillation component, and the first and the second process loops are matched such that the second process loop is run more frequently than the first process loop.

17. The wind power system as claimed in claim 16, wherein the second process loop is run at least 5 times as often as the first process loop, in particular at least 10 times as often.

18. The wind power system as claimed in claim 16, wherein the second process loop is run at least 10 times as often as the first process loop.

* * * * *